United States Patent
Sayyah

(10) Patent No.: US 7,457,489 B2
(45) Date of Patent: Nov. 25, 2008

(54) FREQUENCY TUNING OF PHOTONIC OSCILLATOR USING AMPLIFIER BIAS VOLTAGE

(75) Inventor: Keyvan Sayyah, Santa Monica, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 11/325,913

(22) Filed: Jan. 4, 2006

(65) Prior Publication Data

US 2006/0239695 A1 Oct. 26, 2006

Related U.S. Application Data

(62) Division of application No. 10/663,368, filed on Sep. 16, 2003, now Pat. No. 7,027,675.

(51) Int. Cl.
 G02B 6/12 (2006.01)
 G02B 6/26 (2006.01)
 H04B 10/04 (2006.01)

(52) U.S. Cl. .............. 385/14; 385/15; 385/3; 398/193

(58) Field of Classification Search ........... 385/14, 385/15, 3; 398/193
See application file for complete search history.

(56) References Cited

U.S. PATENT DOCUMENTS

| | | | |
|---|---|---|---|
| 5,777,778 A | | 7/1998 | Yao |
| 6,104,492 A | * | 8/2000 | Giles et al. ............... 356/454 |
| 6,337,660 B1 | | 1/2002 | Esman et al. |
| 6,567,436 B1 | | 5/2003 | Yao |
| 6,580,532 B1 | * | 6/2003 | Yao et al. .................. 398/39 |
| 6,594,061 B2 | * | 7/2003 | Huang et al. .............. 359/239 |
| 6,687,466 B1 | * | 2/2004 | Chiappetta ................ 398/193 |
| 6,873,631 B2 | * | 3/2005 | Yao et al. .................. 372/32 |
| 6,891,149 B1 | | 5/2005 | Lewis et al. |
| 2003/0089843 A1 | | 5/2003 | Yap et al. |

(Continued)

FOREIGN PATENT DOCUMENTS

WO WO 03/043177 A2 5/2003
WO WO 03/043178 A2 5/2003

OTHER PUBLICATIONS

Yao and Maleki, Optoelectronic Oscillator for Photonic Systems, IEEE Journal of Quantum Electronics, vol. 32, No. 7, pp. 1141-1149, Jul. 1996.

*Primary Examiner*—K. Cyrus Kianni
(74) *Attorney, Agent, or Firm*—Christopher R. Balzan

(57) ABSTRACT

In one implementation, a method is provided for frequency tuning of a photonic oscillator. The method includes supplying an optical signal, for example laser light, which is modulated, delayed, and then converted to an electrical signal. The electrical signal is amplified, and used in modulating the optical signal. With this implementation, the frequency of the an output signal of the photonic oscillator is shifted by adjusting a bias voltage of the amplifier. In some implementations, shifting the frequency of the output signal further includes using a frequency lock loop circuit. In some implementations, shifting the frequency of an output signal of the photonic oscillator further comprises adjusting at least one of an phase shifter in series with the amplifier, an optical fiber stretcher, or a bias voltage of a second amplifier.

14 Claims, 5 Drawing Sheets

U.S. PATENT DOCUMENTS

2003/0090767 A1  5/2003  Yap et al.
2003/0090777 A1  5/2003  Yap
2004/0109697 A1* 6/2004  Chiappetta .................. 398/198
2004/0264977 A1  12/2004 Yap et al.
2005/0094926 A1* 5/2005  Dominic et al. ............... 385/14

* cited by examiner

FREQUENCY TUNING OF PHOTONIC OSCILLATOR USING AMPLIFIER BIAS VOLTAGE

CROSS REFERENCE TO RELATED APPLICATION

The present application is a divisional of U.S. patent application Ser. No. 10/663,368, by Sayyah, filed Sep. 16, 2003 now U.S. Pat. No. 7,027,675, entitled FREQUENCY TUNING OF PHOTONIC OSCILLATOR USING AMPLIFIER BIAS VOLTAGE, herein incorporated by reference in its entirety.

ORIGIN OF THE INVENTION

The U.S. Government has a paid-up license in this invention and the right in limited circumstances to require the patent owner to license others on reasonable terms as provided for the terms of contract number F33615-00-C-1674 awarded by DARPA.

BACKGROUND

Photonic oscillators are capable of generating single or multi-tone RF tones. The multi-tone photonic oscillator is a very useful device for generating a set of RF tones with low phase noise and controlled tone spacing.

Typical photonic oscillators generate multi-tone oscillations from RF to millimeter waves with excellent phase noise characteristics, i.e. better than −120 dBC/Hz at 10 kHz offset frequency. There are two important characteristics of the photonic oscillator that clearly differentiates it from conventional electronic oscillators. First, unlike conventional oscillators, the phase noise of this oscillator is independent of its oscillation frequency. Second, the generated low phase noise oscillations are present both in pure electronic form as well as RF tones modulating a lightwave carrier. The latter feature enables fiber remoting of the generated multi-tones for various applications such as local oscillator signals.

The photonic oscillator can be a very compact device well suited for use in a variety of RF photonics and wireless applications requiring multiple simultaneous carrier frequencies. For example, the generation of low phase noise multi-tone RF carriers is well suited for a variety of radar and communications applications. Previous means for generating low phase noise multi-tone carriers with controllable frequency intervals often require bulky and expensive low phase noise RF synthesizers.

Frequency tuning of a photonic oscillator is important since, in most applications, it is desirable to lock its free running oscillation frequencies to a stable reference frequency using a phase locked loop or PLL method to achieve frequency stability in the oscillation tones. Alternatively, frequency tuning allows the photonic oscillator to function as a voltage-controlled-oscillator or VCO with very high spectral purities, while stabilizing its oscillation frequencies by other means such as closed loop temperature and vibration control. These oscillators are known for their low phase noise characteristics. For example, phase noise values better than −125 dBc/Hz at 10 kHz offset at 10 Ghz are routinely measured for these oscillators. Conventional electronic VCOs are not comparable, as they have phase noise performance that is far worse.

Previous methods for frequency tuning of photonic oscillators have several disadvantages. They often rely on a nonstandard component, not used in every implementation of a photonic oscillator, or they add an extra component to the oscillator solely to serve the function of frequency tuning. Furthermore, the frequency tuning range of previous photonic oscillators can be limited.

One example of frequency tuning of photonic oscillators is disclosed by S. Yao and L. Maleki in "Optoelectronic Oscillator for Photonic Systems," published in the *IEEE Journal of Quantum Electronics*, Vol. 32, No. 7, July 1996, herein incorporated by reference. In such a device, the frequency tuning of the photonic oscillator is accomplished by varying the bias voltage of a Mach-Zender electrooptic modulator in the photonic oscillator. The disclosed tuning range, however, is only about 25 kHz.

One disadvantage of the oscillator frequency tuning technique reported in the above article is that it relies on changing the bias voltage of an electrooptic modulator. The same effect, however, may not be present if another type of an optical modulator, such as for example, if an electroabsorption modulator is used in the photonic oscillator instead. In addition, it is not possible to use an external modulator such as one in which the current of the laser feeding the oscillator is directly modulated. In these photonic implementations, the frequency tuning technique described in the above article becomes completely irrelevant.

Another possible technique for frequency tuning a photonic oscillator involves changing the length of the optical fiber delay line in the feedback loop of the oscillator using piezoelectric fiber stretchers. In this technique, the frequency change Δf is given by $\Delta f = f_0 \Delta L/L$, where $f_0$ is the oscillation frequency, L is the length of the optical fiber delay line, and ΔL is the change in the length L.

There are several drawbacks to this technique. One problem with this technique occurs in a dual fiber loop implementation of the photonic oscillator. In such an implementation, the shorter fiber loop determines the frequency spacing of the oscillation multi-tones, while the longer fiber loop improves phase noise, as determined by the above relationship. Due to the locking effect of the tones obtained by the short and long loops, however, the frequency tuning range is limited by that of the longer loop rather than the wider range obtainable if the oscillator was operating with only the short loop alone. Another disadvantage of changing the length of the fiber loop(s) for frequency tuning is the complication and cost of inserting another device in the feedback loop of the photonic oscillator.

Yet another technique to tune the oscillation frequencies of a photonic oscillator is to add an electronic phase shifter in its feedback loop. This technique can result in a large frequency tuning range. This technique, however, again adds to the complication and cost of the photonic oscillator. Furthermore, electronic phase shifters often cause significant insertion loss, and hence have to be compensated by addition gain in the photonic oscillator feedback loop. This additional gain, in turn, adds further noise to the oscillator and degrades its phase noise performance.

SUMMARY

In one implementation of the present invention, a method is provided for frequency tuning of a photonic oscillator. The method includes supplying an optical signal, for example laser light, which is modulated, delayed, and then converted to an electrical signal. The electrical signal is amplified, and used in modulating the optical signal. With this implementation, the frequency of the an output signal of the photonic oscillator is adjusted by adjusting a bias voltage of the amplifier.

In some implementations, adjusting the frequency of the output signal further includes using a frequency lock loop circuit. In some implementations, adjusting the frequency of an output signal of the photonic oscillator further comprises adjusting at least one of an electrical phase shifter in series with the amplifier, an optical fiber stretcher, or a bias voltage of a second amplifier.

In one embodiment of the present invention, a photonic oscillator is provided including a laser and an optical modulator coupled to the laser. A lightwave delay path is coupled to the optical modulator. In some embodiments, dual lightwave delay paths are provided, such as a long loop delay path and a short loop delay path. A photodetector is coupled between the lightwave delay path and an electrical amplifier. Typically, a bandpass filter is coupled between the amplifier and the modulating input of the optical modulator. A control circuit coupled to the amplifier is constructed so as to be capable of adjusting a bias power to the amplifier so as to shift a frequency of an output of the photonic oscillator. In some embodiments, the control circuit may include a frequency lock loop circuit.

DESCRIPTION

Figure 1:
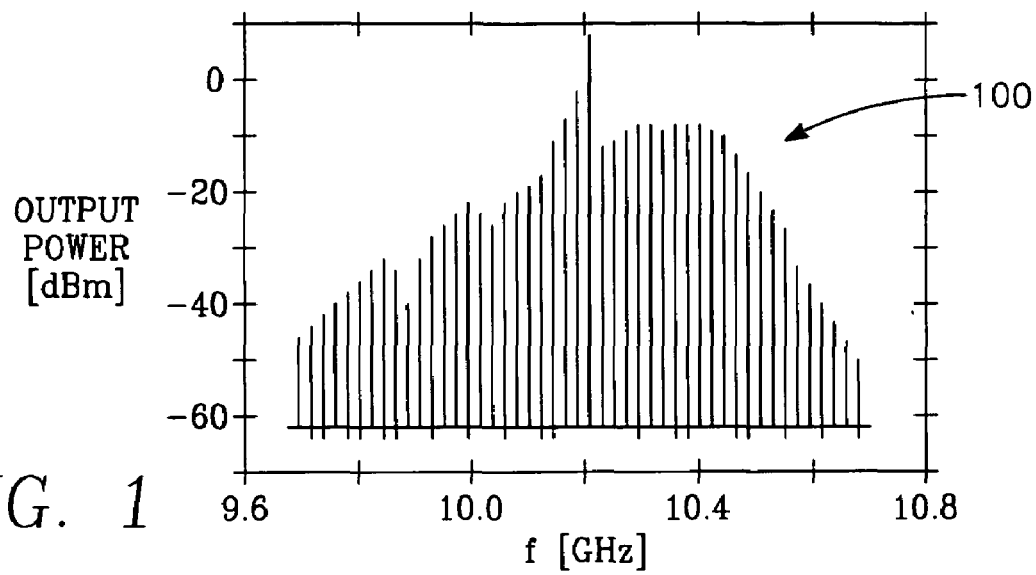
FIG. 1 illustrates an example of a multi-tone output from a photonic oscillator.

FIG. 1 illustrates an example of a multi-tone output 100 from a photonic oscillator. With reference to FIG. 1, frequency tuning involves shifting the group of tones 100 horizontally along the graph. Various embodiments and implementations of the present invention may be utilized in multi-tone as well as single tone photonic oscillators.

Figure 2:
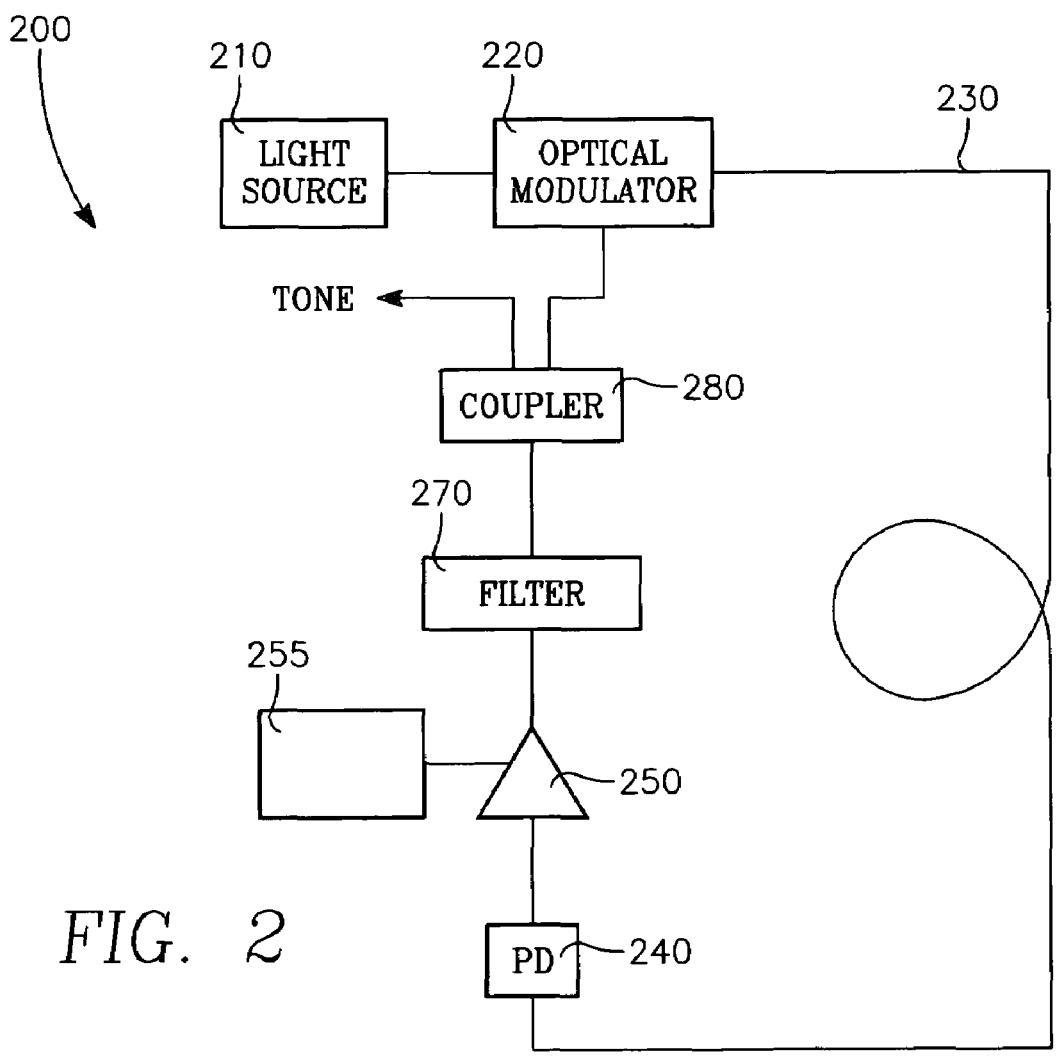
FIG. 2 shows a block diagram of a single loop photonic oscillator.

FIG. 2 shows a block diagram of a single loop photonic oscillator 200. An optical signal may be provided for the photonic oscillator 200 with for example a light source 210. The light source 210 may be a laser, such as a distributed feedback laser, or other laser. An optical modulator 220 is coupled to an output of the light source 210 for modulating the optical signal provided by the light source 210. In the embodiment of FIG. 2, the modulated optical signal is provided to an optical delay path 230, which is coupled to the optical modulator 220. In some embodiments (not shown) the modulated optical signal may also be supplied as an output signal. A photodetector 240 is coupled to the optical delay path 230 to convert the optical signal from the fiber to electrical signals, which may be provided to an electrical amplifier 250.

The electrical amplifier 250, which may be a low noise amplifier or LNA, is coupled between the photodetector 230 and the modulating input of the optical modulator 220. Multiple amplifiers (not shown) may be utilized if desired. A frequency tuning circuit 255 is connected to the amplifier 250 to adjust bias power to the amplifier 250 in response to the frequency of an output of the optical modulator 200. The frequency tuning circuit 255 may allow manual tuning, automatic tuning, or a combination of tuning means responsive to the frequency of an output of the optical modulator 200, and may be electronic, opto-electronic, electro-mechanical, or the like.

A filter 270 is coupled between the amplifier 250 and the modulating input of the optical modulator 220. A coupler 280 may be provided between the amplifier 250 and the optical modulator 220 to provide an electrical output signal. As shown in the embodiment of FIG. 2, the coupler 280 may be connected between the filter 270 and the optical modulator 220. Alternatively, it could be connected between the amplifier 250 and the filter 270.

Figure 3:
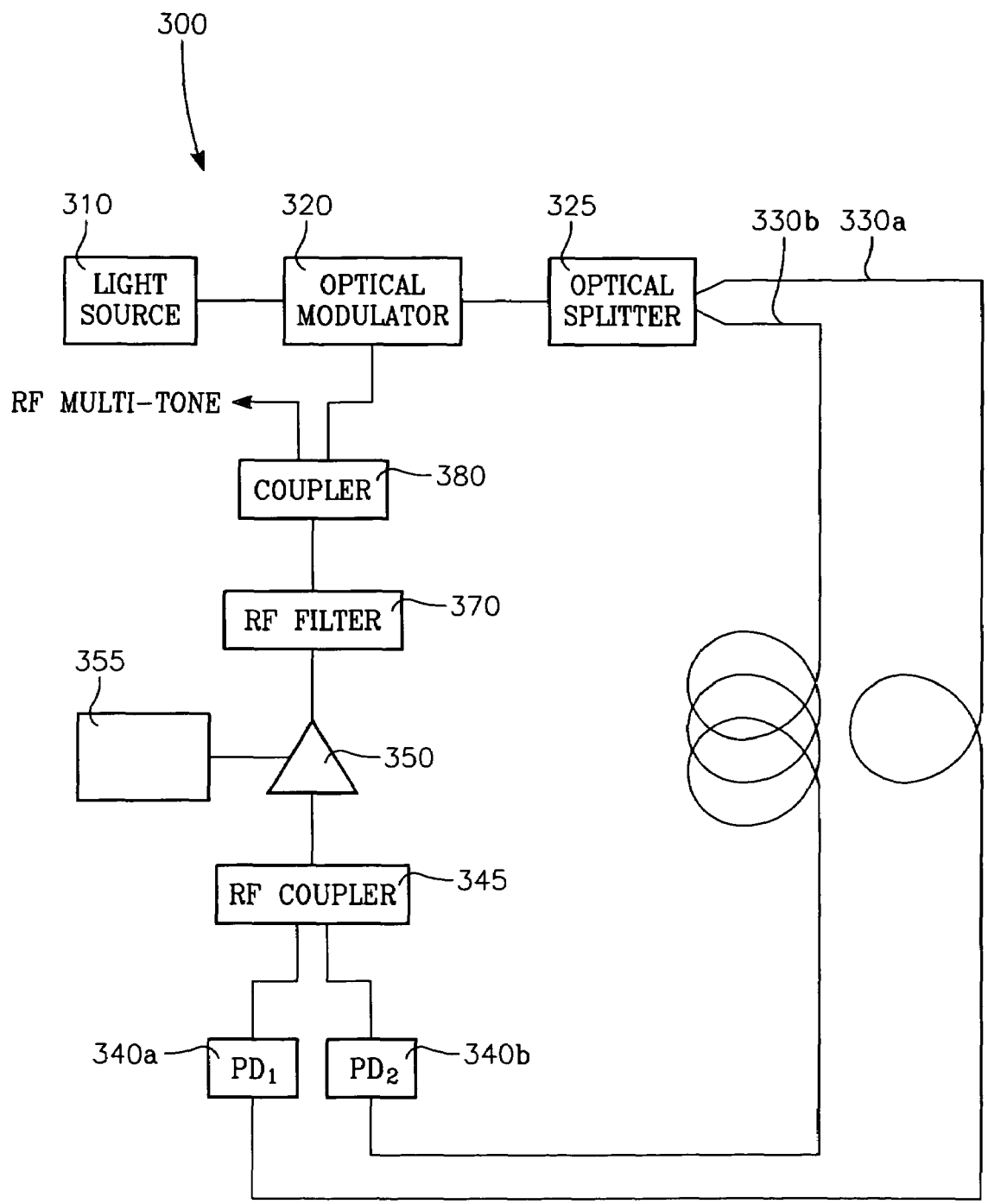
FIG. 3 shows a block diagram of a dual loop embodiment of a photonic oscillator.

The embodiment of FIG. 2 may further include an additional optical delay path as shown in FIG. 3. FIG. 3 shows a block diagram of a dual loop embodiment of a photonic oscillator 300. An optical signal is provided for the photonic oscillator 300 with a light source 310, such as a laser. An optical modulator 320 is coupled to the light source 310 for modulating the optical signal provided by the light source 310. An optical splitter 325 is coupled to the optical modulator 320 to provide signals to the short and long loop optical delay paths 330a and 330b. The short loop 330a adjusts the tone spacing, while the long loop 330b improves phase noise. The short and long loop optical delay paths 330a and 330b are coupled to photodetectors 340a and 340b, respectively. A coupler 345 couples the electrical signals from the photodetectors to an electrical amplifier 350, such as a low noise amplifier.

The electrical amplifier 350 is coupled between the photodetectors 340a and 340b and the modulating input of the optical modulator 320. A frequency tuning circuit 355 is connected to adjust bias power to the amplifier 350 in response to the frequency of an output of the optical modulator 300. The frequency tuning circuit 355 may allow manual tuning, automatic tuning, or a combination of tuning means responsive to the frequency of an output of the optical modulator 300, and may be electronic, opto-electronic, electro-mechanical, or the like.

A filter 370 is coupled between the amplifier 350 and the modulating input of the optical modulator 320. A coupler 380 may be provided between the amplifier 370 and the optical modulator 320 to provide an electrical output signal.

Although not shown in FIG. 2 or 3, in certain embodiments, further frequency tuning may be obtained by including additional tuning apparatus. For example, in some embodiments, an electrical phase shifter may be coupled between the amplifier and the optical modulator. In some embodiments, fiber stretchers may inserted along the optical delay paths. Moreover, in some embodiments, an electrooptic modulator with bias control means may be utilized, such as a Mach-Zender electrooptical modulator. Furthermore, additional amplifiers, with or without bias power adjustment, may be included. Some, or all of the above apparatus may be present in various embodiments.

Figure 4:
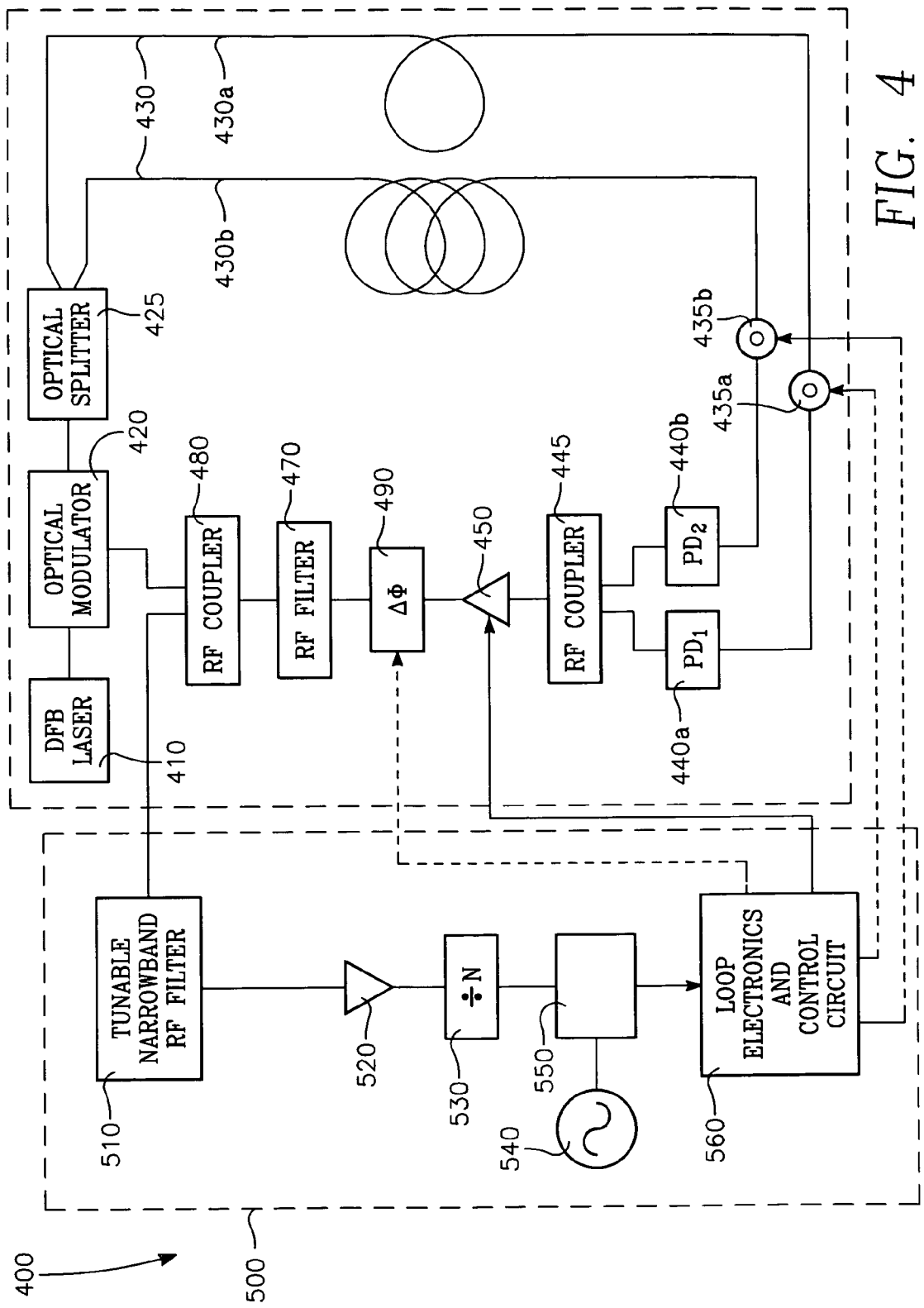
FIG. 4 shows a block diagram of one embodiment of a dual loop photonic oscillator.

FIG. 4 shows a block diagram of one embodiment of a dual loop photonic oscillator 400. In this embodiment, a distributed feedback laser 410 is coupled to an optical modulator 420. An optical splitter 425 coupled to the optical modulator 420 provides optical signals to a dual loop optical delay path 430. The dual loop optical delay path 430 includes a short loop optical delay path 430a and a long loop optical delay path 430b. The short and long loop optical delay paths 430a and 430b are coupled to photodetectors 440a and 440b, respectively. In the embodiment of FIG. 4, fiber stretchers 435a and 435b are located along the optical delay paths 430a and 430b, respectively. The fiber stretchers 435a and 435b may be utilized for further tuning of the output signal. In the embodiment of FIG. 4, an RF coupler 445 combines the electrical signals from the photodetectors and couples it to an electrical amplifier 450, such as a low noise amplifier.

The electrical amplifier 450 is coupled to a phase shifter 490, which may be utilized for further tuning. An RF coupler 480 provided between the phase shifter 490 and the optical modulator 420 provides a multi-tone electrical signal to the optical modulator 420 via a bandpass RF filter 470.

A frequency lock loop circuit 500 may be used to tune the frequency of the output signal of the photonic oscillator. In the example embodiment of FIG. 4, the frequency lock loop circuit 500 includes a narrow band filter 510 coupled to one of the outputs of the RF coupler 480. The narrow band filter 510 filters the multi-tone signal to provide a single frequency signal. An amplifier 520 coupled to the narrow band filter 510 may be provided to amplify the single frequency signal. The output of the amplifier 520 is supplied to a frequency divider 530. The frequency divider 530 along with a reference oscillator 540 is coupled to the inputs of a mixer 550. The reference oscillator 540 may be a precision low frequency oscillator. The mixer 550 output is coupled to a loop electronics and control circuit 560. The loop electronics and control circuit 560 controls the bias power of the amplifier 450 to frequency shift the multi-tone signals so as to reduce the difference between the reference signal and the divided signal.

In some embodiments, the loop and electronics circuit additionally may provide control signals to fiber stretchers 435a and 435b, a phase shifter 490, a Mach-Zender optical modulator (not shown), and/or additional amplifiers (not shown).

The frequency lock loop embodiment of FIG. 4 is provided for example purposes. Certain embodiments of the present invention can be used in other applications of voltage controlled multi-tone or single tone oscillators.

In this embodiment, the laser light, which supplies the power for the oscillator 400, is modulated by the RF signal at the electrical input of the modulator 420. The modulated lightwave is then sensed by the photodetectors 440a and 440b whose electrical output is fed back to the modulator 420 following amplification and bandpass filtering. The bandpass filter 470 sets the bandwidth of the generated RF multi-tone comb spectrum, shown in FIG. 1.

During operation, random electrical noise generated in the feedback loop modulates the laser light and is regeneratively fed back to the modulator 420 after propagating through the optical delay paths 430a and 430b and photodetection. This constitutes a positive feedback if the open loop gain of the oscillator 400 is greater than one. This amplification of the noise signals as result of positive feedback occurs at frequency intervals $\Delta f$ equal to an integer multiple of the inverse of the loop delay time $\tau$ as follows:

$$\Delta f = k/\tau$$

where
  k is an integer.

This results in potential multi-tone oscillations at the above frequency intervals. The delay loop also acts as a storage medium to increase the quality factor Q of the oscillator, which is proportional to the square of the delay time of the loop as follows:

$$Q = 2\pi f \tau^2 / \delta$$

where
  f is the oscillation frequency, and
  $\delta$ is the input noise-to-signal ratio to the oscillator.

Thus, the oscillator phase noise S(f'), which is inversely proportional to this quality factor $$S(f') = \frac{\delta}{(2\pi)^2 (\tau f')^2}$$

where f' is the offset frequency, decreases quadratically as the optical delay in the loop is increased.

The purpose of having two optoelectronic feedback loops 430a and 430b is to be able to independently control the tone spacing of the generated multi-tones and concurrently have low phase noise oscillations. This is due to the fact that, as indicated above, both the tone spacing and the phase noise are inversely proportional to the loop delay. This implies that the generally desirable goal of generating oscillation tones with low phase noise is concurrent with multi-tones with small tone spacing. This problem can be solved by having a short and a long delay path 430a and 430b in the photonic oscillator feedback loop. The tone spacing is now determined by the inverse of the delay time in the short loop while the long delay time in the second loop determines the phase nose. FIG. 1 shows a multi-tone oscillation in a dual-loop photonic oscillator 400 with a long fiber loop of 1 km and a short fiber loop of about 8 m. This results in multi-tones with a tone spacing of about 25 MHz centered in the X band together with a phase noise of better than −125 dBc/Hz at 10 kHz offset frequency.

The multi-tone photonic oscillator described above is free-running, and hence, there is a drift in the oscillation frequencies as a result of variations in environmental parameters such as temperature and vibration. An effective method to stabilize the oscillation frequencies is to lock the photonic oscillator to a reference source with good frequency stability.

Fiber stretchers may be used to change the length of the optical fiber delay paths in the feedback loop of the photonic oscillator. In the dual loop implementation of the photonic oscillator, the fiber stretcher approach has a more limited range of frequency tuning compared to a single-loop oscillator configuration. For maximum frequency tuning, the fiber stretcher should be placed in the short fiber of the dual loop photonic oscillator since $\Delta f = f_0 \Delta L / L$. In the dual loop photonic oscillator, however, since the tones produced as a result if oscillations in the shorter loop lock to potential tones oscillating in the longer loop, the frequency shift obtained by varying the length of the short loop is less than what would have been obtained in a photonic oscillator with only the same short loop present. For example, in a photonic oscillator with a long fiber loop of 1 km and a short fiber loop of about 10 m, a frequency tuning of only 2.5 kHz was observed experimentally when either the short or the long fiber loops were stretched by about 100 µm in a PZT fiber stretcher with the other fiber loop still part of the feedback loop. With the long fiber removed from the loop, however, it was found that the frequency tuning obtained by stretching the short loop alone by the same amount (100 μm) increased to about 80 kHz. Some PZT fiber stretchers may require very high voltages in the range of 100-200 V.

Experimental Results (FIGS. 5-8)

Turning to FIGS. 5-8, in one embodiment in accordance with the setup of FIG. 3, a distributed feed back laser with an output power set to about 10 mW feeds the dual-loop photonic oscillator with a long fiber loop of 1 km and a short fiber loop of 8 m. The electrical portion of the feedback loop included two low-noise amplifiers, both with gains of about 30 dB each in the X band, and a bandpass filter centered at 10 Ghz with a passband of 1 Ghz. There is also a manual electrical phase shifter in the feedback loop which allows starting of the multi-tone oscillations. The output of the electrical portion of the loop feedback into the modulation port of a Mach-Zender electrooptical modulator, thus closing the feedback loop. A multi-tone spectrum similar to the one shown in FIG. 1 was observed.

Figure 5:
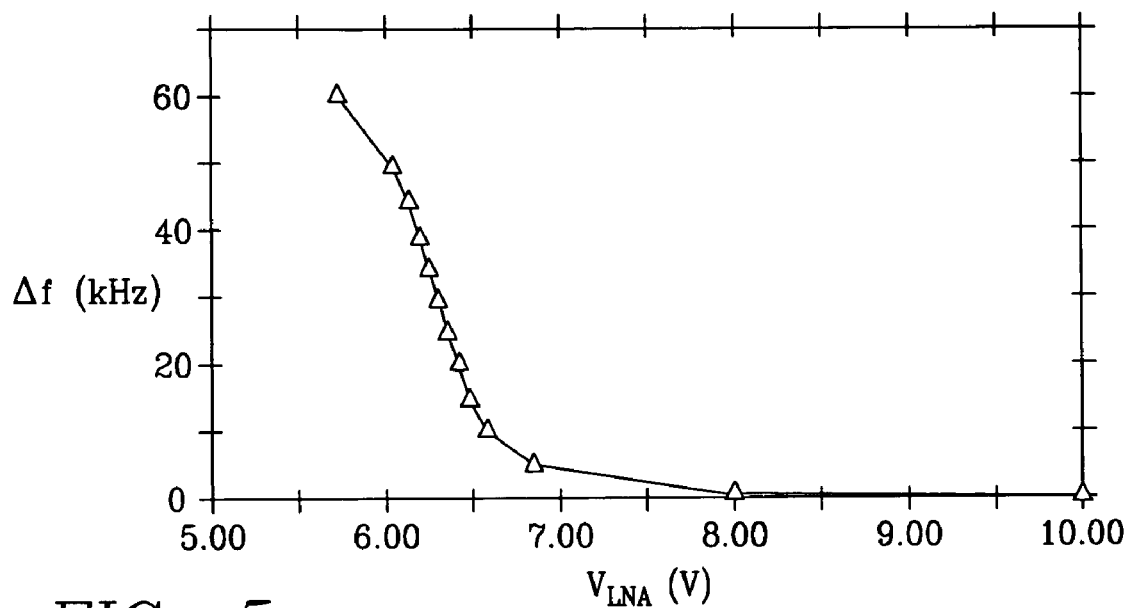
FIG. 5 illustrates an example graph of frequency tuning of a dual-loop, multi-tone photonic oscillator using an low noise amplifier bias control showing a tuning range of about 60 kHz in accordance with one implementation of the present invention.

To tune the frequency of the multi-tone photonic oscillator, the bias current of one of the electrical amplifiers in the feedback loop was varied. The result is illustrated in FIG. 5. FIG. 5 illustrates frequency tuning of a dual-loop, multi-tone photonic oscillator using an low noise amplifier bias control showing a tuning range of about 60 kHz. A frequency turning range of 60 kHz may be obtained by varying the bias voltage of the amplifier from 8V to slightly below 6V.

Figure 6:
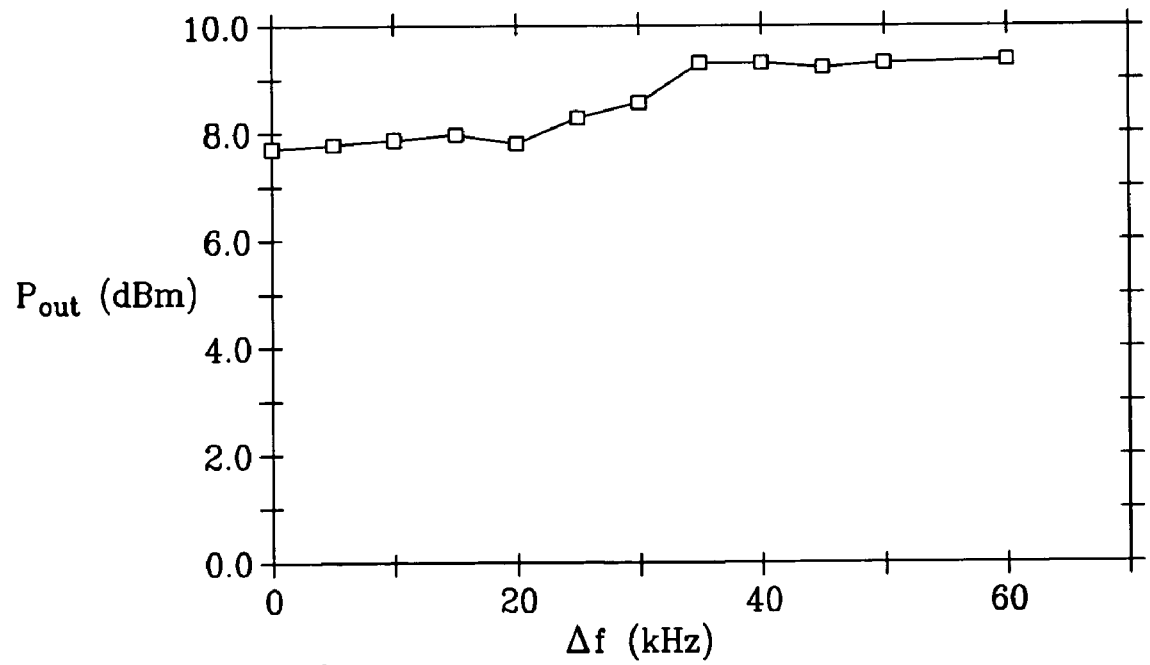
FIG. 6 illustrates an example graph output power variation of a tuned photonic oscillator verses frequency tuning for the photonic oscillator embodiment of FIG. 5.

FIG. 6 illustrates output power variation of a tuned photonic oscillator verses frequency tuning. The output power of the tuned spectral line was measured as a function of the tuning range for the embodiment discussed with reference to FIG. 5. As shown in FIG. 6, the variations in the output power $P_{out}$ were observed to be about 1.5 dB throughout the entire frequency tuning range. It should be noted that the frequency tuning range of 60 kHz was obtained with varying the bias current of only one of the amplifiers in the photonic oscillator feedback loop. By varying the bias current of the second amplifier, a range greater than 60 kHz was obtained (to about 70-80 kHz in this example embodiment). For comparison, a frequency tuning range of only 20 kHz was obtained when the bias voltage of the Mach-Zender electrooptic modulator was varied by $V_\pi/2$, the half-voltage of the modulator.

Figure 7:
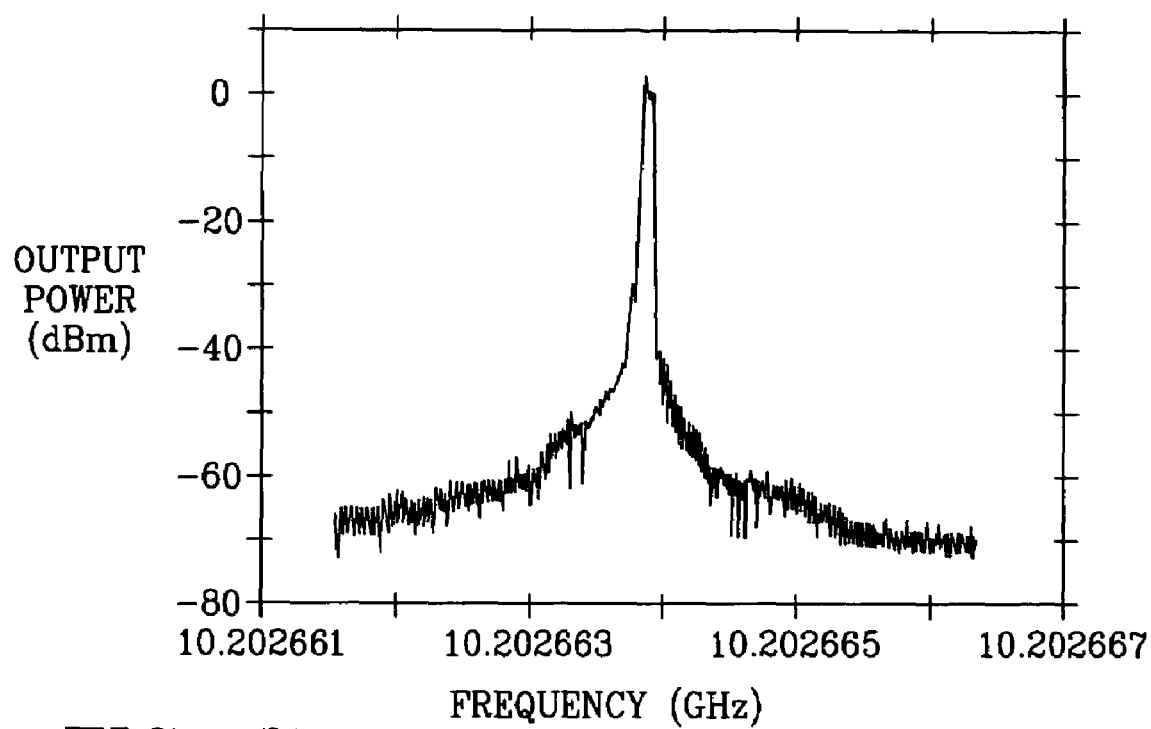
FIG. 7 illustrates an example graph of a close in, 5 kHz span, spectral purity shape of an oscillation tone in a photonic oscillator with zero frequency tuning for the photonic oscillator embodiment of FIG. 5.
Figure 8:
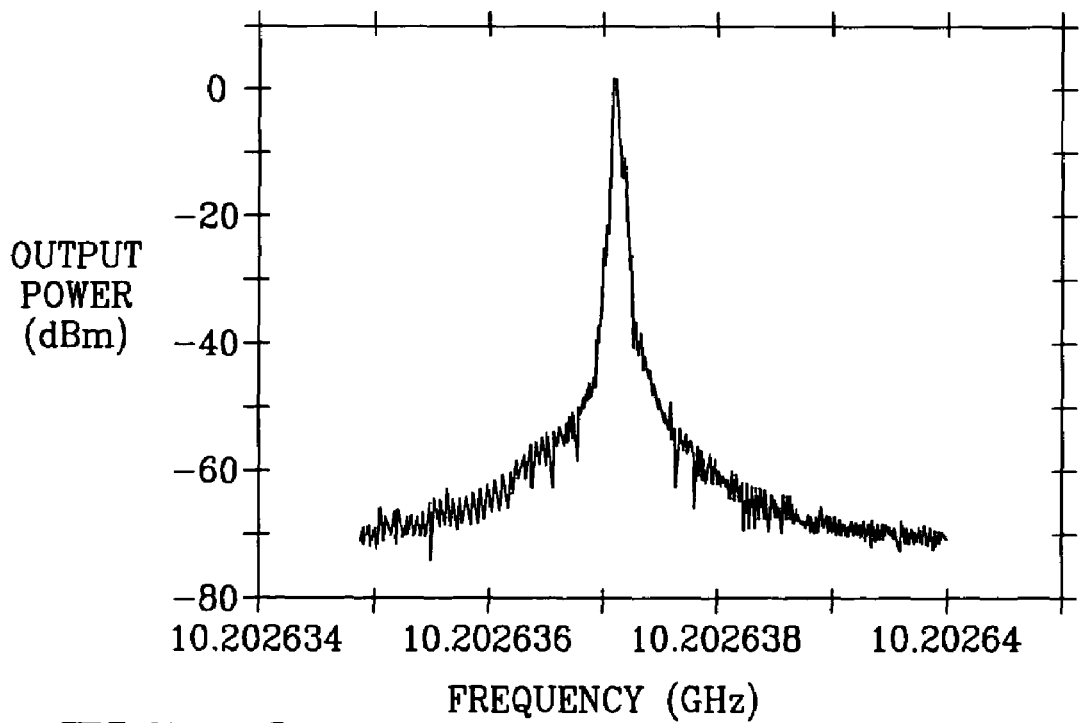
FIG. 8 illustrates an example graph of a close in, 5 kHz span spectral purity shape of an oscillation tone for the photonic oscillator embodiment of FIG. 5 with 30 kHz of frequency tuning.

Turning to FIGS. 7 and 8, the spectral purity of the oscillation tones was evaluated for the embodiment discussed with reference to FIGS. 5 and 6. FIGS. 7 and 8 show the close-in spectral purity shape of one of the oscillations tones in the multi-tone photonic oscillator at zero de-tuning in the tone frequency, and when the tone was frequency tuned by 30 kHz. FIG. 7 illustrates a close-in (5 kHz) spectral purity shape of an oscillation tone in photonic oscillator with zero frequency tuning. FIG. 8 illustrates a close-in spectral purity shape of an oscillation tone in photonic oscillator with 30 kHz frequency tuning. Thus, no change in the spectral shape was observed as a function of frequency tuning, even at a very narrow frequency span of only 5 kHz in the spectrum. This is a very good indication that the phase noise of the oscillation tone is not compromised by this frequency tuning technique.

The saturated gain of the amplifier was measured as a function of the bias voltage for the above embodiment. A reduction of the amplifier gain by about 3 dB was observed for the range of the bias voltage that resulted in a frequency tuning of about 60 kHz. In contrast, a more significant change in the magnitude of the open loop gain is obtained when the bias voltage of the Mach-Zender electrooptic modulator is changed by $V_\pi/2$, the half-voltage of the modulator, yields only a 20 kHz frequency tuning range. Therefore, the frequency tuning of the photonic oscillator is not primarily due to the decrease in the magnitude of the open loop gain as the amplifier voltage is reduced. It is further contemplated that the electric phase change in the amplifier as its bias voltage is reduced may have contributed to the observed tuning range of the frequency. Nevertheless, the amplifier voltage-induced frequency tuning allows for a significantly larger tuning range, which may be accomplished without compromising the spectral purity of the oscillation tones.

Having described this invention in connection with a number of embodiments, modification will now certainly suggest itself to those skilled in the art. As such, the invention is not to be limited to the disclosed embodiments except as required by the appended claims.

What is claimed is:

1. A method for frequency tuning of a photonic oscillator comprising:
 a) supplying an optical signal;
 b) modulating the optical signal;
 c) delaying the modulated optical signal;
 d) converting the modulated optical signal to an electric signal after delaying the optical signal;
 e) amplifying the electric signal;
 f) wherein modulating the optical signal comprises using the electric signal after amplifying; and
 g) shifting a frequency of an output signal of the photonic oscillator by adjusting a bias voltage of a first amplifier amplifying the electric signal.

2. The method of claim 1 wherein shifting the frequency of the output signal of the photonic oscillator further comprises using a frequency lock loop circuit.

3. The method of claim 2 wherein delaying the modulated optical signal comprises passing a portion of the optical signal through a long loop delay path and a portion of the modulated optical signal through a short loop delay path.

4. The method of claim 1 wherein delaying the modulated optical signal comprises passing a portion of the modulated optical signal through a long loop delay path and a portion of the modulated optical signal through a short loop delay path.

5. The method of claim 4 further comprising:
 a) selecting a tone from a multi-tone output signal;
 b) dividing a frequency of the selected tone;
 c) providing a low frequency reference signal; and
 d) locking the frequency of the tone after dividing, to the low frequency reference signal by adjusting the bias voltage of the first amplifier.

6. The method of claim 4 wherein shifting the frequency of an output signal of the photonic oscillator further comprises adjusting at least one of (1) an electrical phase shifter in series with the first amplifier; (2) an optical fiber stretcher; or (3) a bias voltage of a second amplifier coupled in series with the first amplifier.

7. A method for frequency tuning of a photonic oscillator comprising:
 a) providing an optical signal;
 b) passing the optical signal through an optical delay path via a modulator;
 c) producing an electrical signal from an output of the optical delay path;
 d) amplifying the electrical signal using a first amplifier;
 e) modulating the optical signal using the electrical signal from the first amplifier; and f) adjusting a bias voltage of the first amplifier in response to an output signal of the photonic oscillator so as to shift a frequency of the output signal of the photonic oscillator.

8. The method of claim 7 wherein shifting the frequency of the output signal of the photonic oscillator further comprises using a frequency lock loop circuit.

9. The method of claim 8 wherein passing the optical signal through the optical delay comprises passing a portion of the optical signal through a long loop delay path and a portion of the optical signal through a short loop delay path.

10. The method of claim 9 wherein using the frequency lock loop circuit comprises:
   a) selecting a tone from a multi-tone output signal;
   b) dividing a frequency of the selected tone;
   c) providing a low frequency reference signal; and
   d) locking the frequency of the tone after dividing, to the low frequency reference signal by adjusting the bias voltage of the first amplifier.

11. The method of claim 10 wherein shifting the frequency of the output signal of the photonic oscillator further comprises adjusting at least one of: (1) an electrical phase shifter in series with the first amplifier; (2) an optical fiber stretcher; or (3) a bias voltage of a second amplifier coupled in series with the first amplifier.

12. The method of claim 7 wherein passing the optical signal through an optical delay comprises passing a portion of the optical signal through a long loop delay path and a portion of the optical signal through a short loop delay path.

13. The method of claim 12 further comprising:
   a) selecting a tone from a multi-tone electrical output signal;
   b) dividing a frequency of the selected tone;
   c) providing a fixed low frequency signal; and
   d) locking the divided frequency of the selected tone with the fixed low frequency signal by adjusting the bias voltage of the first amplifier.

14. The method of claim 12 wherein shifting the frequency of an output signal of the photonic oscillator further comprises adjusting at least one of (1) an electrical phase shifter in series with the first amplifier; (2) an optical fiber stretcher; or (3) a bias voltage of a second amplifier coupled in series with the first amplifier.

* * * * *